United States Patent
Barr et al.

(10) Patent No.: US 7,276,986 B2
(45) Date of Patent: Oct. 2, 2007

(54) METHOD AND APPARATUS FOR IMPROVING SIGNAL INTEGRITY IN A HIGH SPEED FLEX CABLE

(75) Inventors: Andrew H. Barr, Roseville, CA (US); Jeremy I. Wilson, Rocklin, CA (US); Robert W. Dobbs, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 223 days.

(21) Appl. No.: 10/358,903

(22) Filed: Feb. 5, 2003

(65) Prior Publication Data

US 2004/0150486 A1    Aug. 5, 2004

(51) Int. Cl.
*H03K 5/00*      (2006.01)
*H03H 7/24*      (2006.01)

(52) U.S. Cl. .................. 333/1; 327/559; 333/28 R
(58) Field of Classification Search .............. 333/1, 333/12, 28 R, 81 R; 174/262, 268, 269, 174/254, 255; 385/24; 327/552, 559
See application file for complete search history.

(56) References Cited

U.S. PATENT DOCUMENTS

| | | | | |
|---|---|---|---|---|
| 4,970,722 A | * | 11/1990 | Preschutti | 370/407 |
| 5,282,932 A | * | 2/1994 | Ayton | 162/100 |
| 5,669,775 A | * | 9/1997 | Campbell et al. | 439/77 |
| 5,680,384 A | * | 10/1997 | Seki et al. | 369/112.29 |
| 5,929,719 A | * | 7/1999 | Turner | 333/81 R |
| 5,982,785 A | * | 11/1999 | Woerner et al. | 370/488 |
| 6,236,776 B1 | * | 5/2001 | Sakuyama | 385/24 |
| 6,281,451 B1 | * | 8/2001 | Chan et al. | 174/262 |
| 6,333,468 B1 | * | 12/2001 | Endoh et al. | 174/256 |
| 6,590,466 B2 | * | 7/2003 | Lin et al. | 333/1 |

FOREIGN PATENT DOCUMENTS

| | | | | |
|---|---|---|---|---|
| JP | 04190508 A | * | 7/1992 | |
| JP | 405159554 A | * | 6/1993 | |
| JP | 408279688 A | * | 10/1996 | |
| JP | 02002025641 A | * | 1/2002 | |

* cited by examiner

*Primary Examiner*—Dinh T. Le

(57) ABSTRACT

A method for decreasing high-frequency attenuation effects in a flexible cable includes communicatively coupling signal-enhancing circuitry to a signal layer of the flexible cable.

33 Claims, 8 Drawing Sheets

METHOD AND APPARATUS FOR IMPROVING SIGNAL INTEGRITY IN A HIGH SPEED FLEX CABLE

BACKGROUND

The use of computers and computer networks pervades virtually every business and enterprise in the modern world. As the technology associated with computers and computer networks progresses, the industry has constantly focused on making computers and computer networks both smaller and faster. As components become increasingly efficient, methods of saving component space and increasing processing speed are becoming invaluable.

One way that the computer industry has managed to save space while decreasing processing time is by using multi-conductor flexible cables to connect printed circuit boards (PCBs) or other components. Multi-conductor flexible cables are constructed from multiple lengths of electrical wire that are arranged in parallel and are provided with insulation between them. Generally, such cables are used to carry signals between electrical devices connected by the cable. Such cabling may be in the form of a flexible circuit cable in which conductors are plated on insulation layers. These cables are generally referred to as flexible cables. Multi-conductor flexible cables may also be in the form of separate but adjacent, discrete wires, typically round wires surrounded by an insulating layer. These cables are generally referred to as flat ribbon cables.

Multi-conductor flexible cables are typically connected to electrical devices with pin and socket connectors. Each conductor or wire in the flexible cable is electrically connected to a pin of a pin connector at the end of the cable. The pin connector is received into a socket connector on the device being interconnected.

Flexible cables can be used to save space when connecting computing components because the wire diameters of the multi-conductor flexible cables are such that the multi-conductor flexible cables are relatively flexible and therefore can be manipulated around tight corners and small spaces typically encountered inside computer devices or in the home and office environment.

As processor and other components have increased in speed and efficiency, greater demands have been placed on the connection mediums that transfer signals between computer components, especially multi-conductor flexible cables. In order to accommodate the increased data transfer rates preferred by high-speed applications, a number of configurations and materials have been incorporated into the multi-conductor flexible cable technology. However, with the increase in transmission rates come additional concerns regarding signal integrity that must be addressed.

Often, high-speed serial data links suffer from waveform degradation and noise. Resolution of the waveform degradation and signal noise is limited by the tension between space limitations and signal quality.

SUMMARY

In one of many possible embodiments, the present invention provides a method for decreasing high-frequency attenuation effects in a flexible cable by communicatively coupling signal-enhancing circuitry to a signal layer of the flexible cable.

In another embodiment, the present invention provides an apparatus for transmitting data signals between electrical devices while reducing high-frequency signal attenuation effects, where the apparatus includes a flexible cable including a plurality of signal lines, and signal-enhancing circuitry communicatively coupled to one or more of the signal lines of the flexible cable and the signal-enhancing circuitry functions as a high-pass filter.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

Throughout the drawings, identical reference numbers designate similar, but not necessarily identical, elements.

DETAILED DESCRIPTION

An apparatus for improving signal integrity during high-speed data transmission over a flexible cable is described herein and is based on reducing the effect of high-frequency attenuation in high-speed data transmission while reducing the use of printed circuit board space. According to one exemplary implementation, described more fully below, an equalization network is placed directly on the flexible cable to act as a high-pass filter thereby reducing the effects of the high-frequency attenuation.

In the following description, for purposes of explanation, numerous specific details are set forth in order to provide a thorough understanding of the invention. It will be apparent, however, to one skilled in the art that the invention can be practiced without these specific details. Reference in the specification to "one embodiment" or "an embodiment" means that a particular feature, structure, or characteristic described in connection with the embodiment is included in at least one embodiment of the invention. The appearance of the phrase "in one embodiment" in various places in the specification are not necessarily all referring to the same embodiment.

Exemplary Structure

Figure 1:
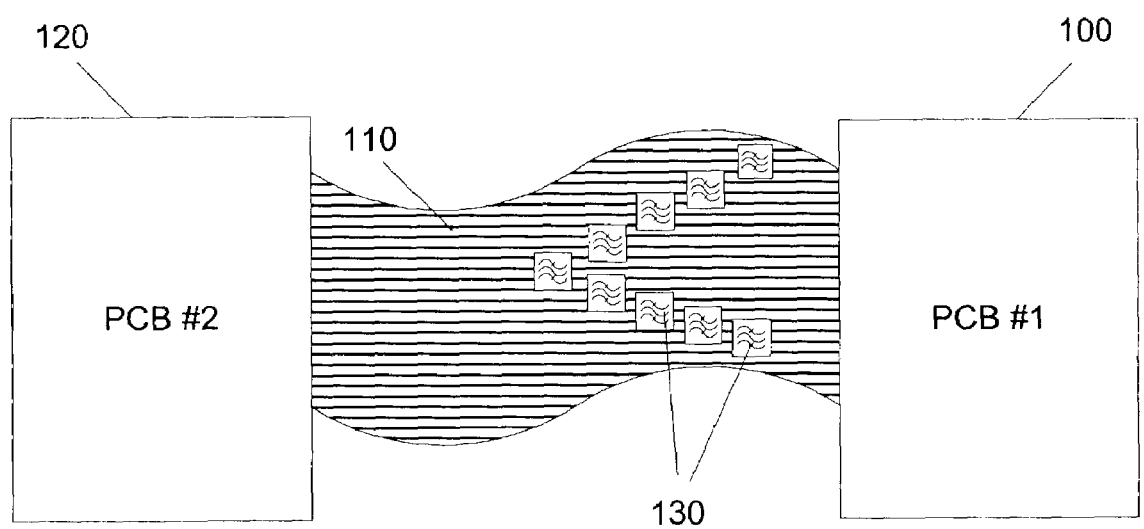
FIG. 1 illustrates a multi-conductor flexible cable connecting two printed circuit boards according to one embodiment of the present invention.

FIG. 1 illustrates a system for improving the signal integrity in a high-speed flexible cable. As shown in FIG. 1, a first electrical device (100) is communicatively coupled to a second electrical device (120) by a high-speed signal connection medium (110). Additionally, at least one signal-enhancing circuit (130) is located on the high-speed signal connection medium (110).

Figure 5:
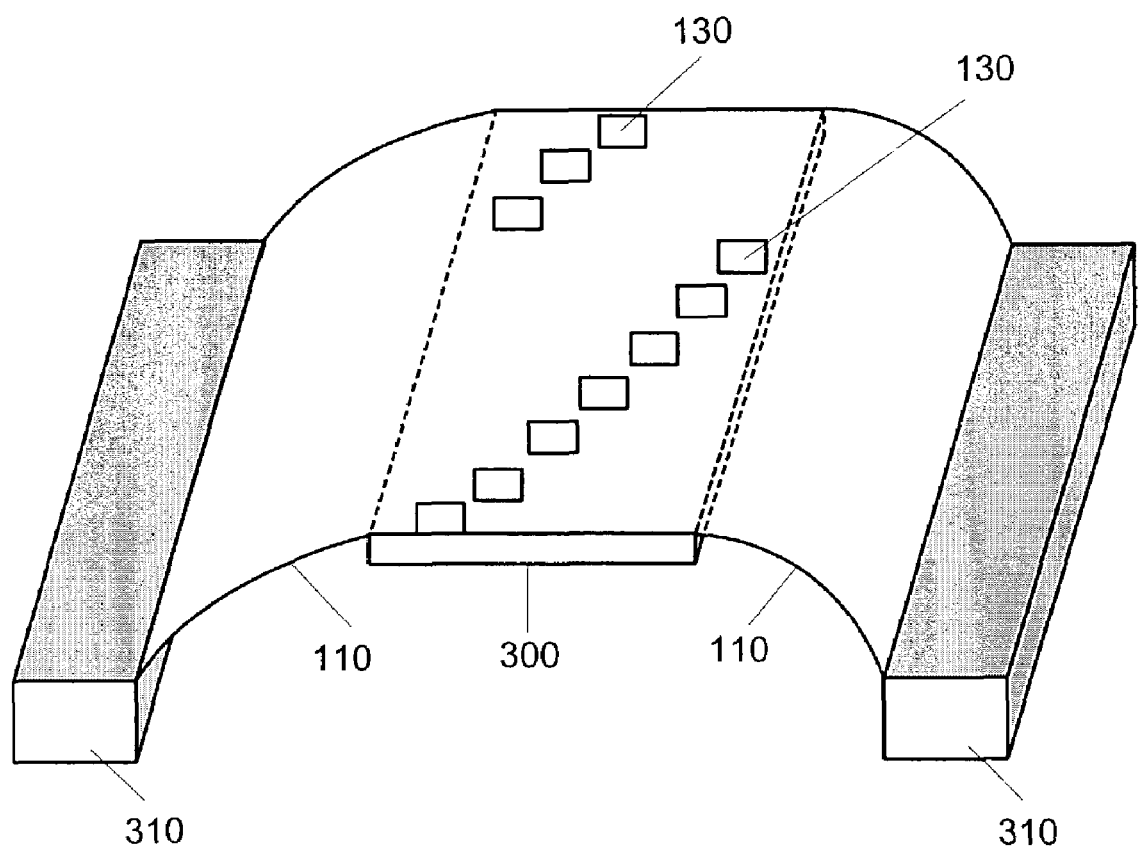
FIG. 5 illustrates a multi conductor flexible cable including a rigid component placement section according to one embodiment of the present invention.

The first electrical device (100) and the second electrical device (120) illustrated in FIG. 1 may be any electrical device that includes a means for connecting to a high-speed signal connection medium (110) and is capable of both sending and receiving high-speed signals through the high-speed signal connection medium (110). The electrical devices (100, 120) may be any one of, but in no way limited to, a printed circuit board, a disk drive, a processor, a backplane system, a data storage device, or a server. The electrical devices (100, 120) will be referred to hereinafter as printed circuit boards (PCBs). The high-speed signal connecting medium (110) may be connected to PCB #1 (100) and PCB #2 (120) by pin and socket connectors (310; FIG. 5). Each conductor or wire in the high-speed signal connection medium (110) is electrically connected to a pin (not shown) of a pin connector at the cable end. The pin connector is then received into a socket connector that is located on the PCB (100, 120).

The PCBs (100, 120) are communicatively coupled through the signal connection medium (110). The signal connection medium (110) may be any medium containing one or more conductors capable of transmitting high-speed signals between the PCBs (110, 120). For ease of explanation, and not by way of limitation, the signal connection medium (110) will be described and hereafter referred to as a high-speed flexible cable (110).

Figure 2:
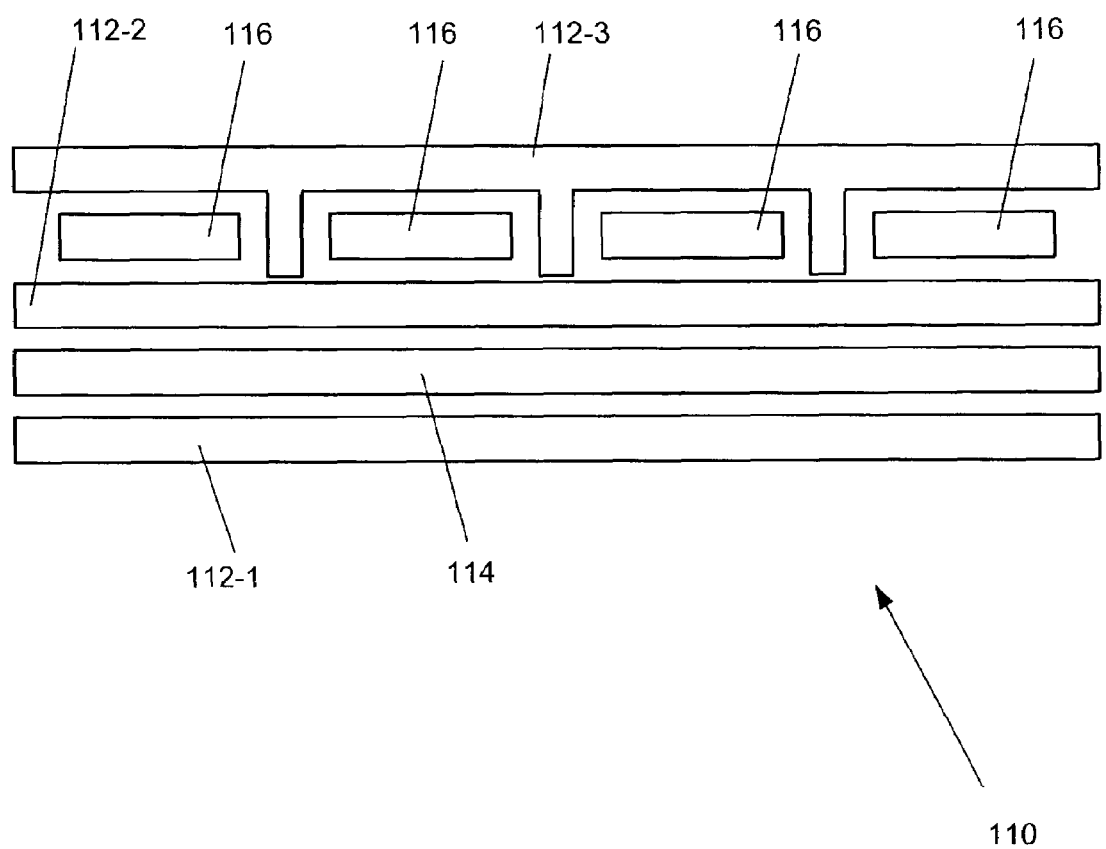
FIG. 2 is a cross-section view of a high-speed multi-conductor flexible cable according to one embodiment of the present invention.

FIG. 2 illustrates a cross-sectional view of one embodiment of a high-speed flexible cable (110) that includes multiple conductors. A shown in FIG. 2, the bottom layer (112-1) of the multi-conductor flexible cable (110) is a laminated dielectric layer (112-1). A dielectric layer is a layer of material that is a poor conductor of electricity but an efficient supporter of electrostatic fields. Dielectric layers (112) are able to support an electrostatic field while dissipating minimal energy in the form of heat. Materials that may be used as a dielectric layer include, but are in no way limited to, porcelain (ceramic), mica, glass, plastics, and metal oxides.

Above the bottom dielectric layer (112-1) is a conductive power plane (114). The conductive power plane (114) of FIG. 2 provides both a reference and a return path during data transmission between the PCBs (100, 120; FIG. 1). The conductive power plane (114) of FIG. 2 may be made of any conductive material capable of providing a reference voltage during data transmission between any number of electrical devices. Immediately above the conductive power layer is another dielectric layer (112-2) to further insulate the conductive power plane (114). Above the second dielectric layer (112-2) is a conductive metal signal layer (116). The conductive metal signal layer (116) illustrated in FIG. 2 may be divided into any number of metal signal lines that run parallel along the length of the high-speed flexible cable (110, FIG. 1). The signal lines of the conductive metal signal layer (116) may be made of any conductive material capable of being a communication medium for high-speed signals including, but in no way limited to, fiber channel or tightly coupled differential lines. Immediately above and between the conductive metal signal layers (116) is another dielectric layer (112-3) to insulate and protect the conductive metal signal layer (116).

The conductive metal signal layer (116) illustrated in FIG. 2 may be a fibre channel. Fibre channel is a technology that is currently capable of transmitting data between computer devices at a data rate of up to 1 Giga bit per second (Gbps), or one billion bits per second. Moreover, the Fibre Channel Industry Association has proposed a data rate of 10 Gbps for fibre channel. Fibre channel is especially suited for providing high-speed data connections between PCB's (100, 120; FIG. 1) because of its capability for high data transmission rates and its flexibility. The Fibre Channel Physical and Signaling standard, and the ANSI X3.230-1994, which is also ISO 14165-1 may govern the fibre channel data transmission of the present invention.

While the preceding examples describe the high-speed flexible cable (110; FIG. 1) as containing a single conductive metal signal layer (116) and a single conductive power plane (114), the high-speed multi-conductor flexible cable (110) may have any number of conductive metal signal layers (116) and any number of conductive power planes (114) separated by dielectric laminates (112).

Figure 3:
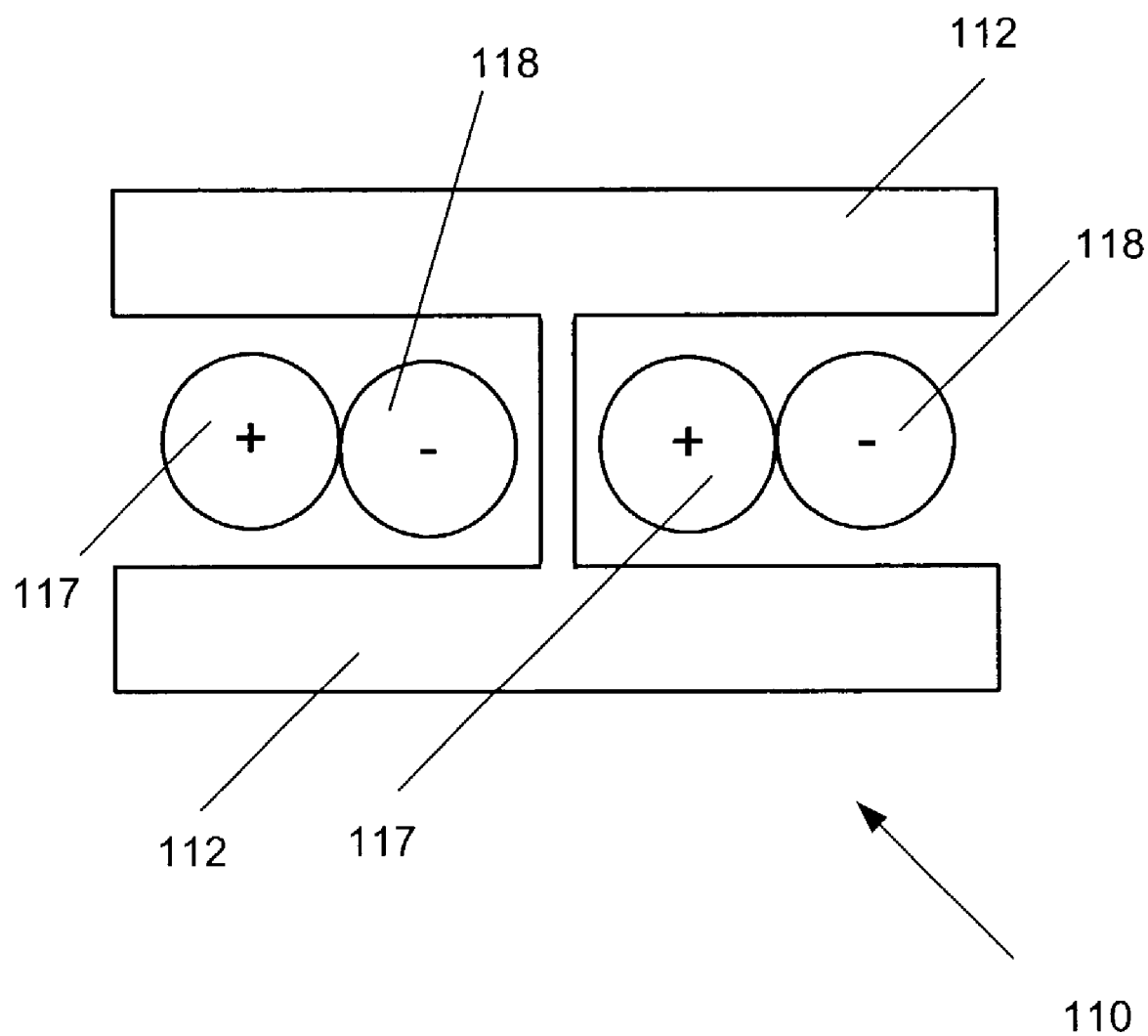
FIG. 3 is a cross-section view of a high-speed multi-conductor flexible cable including differential pairs according to one embodiment of the present invention.

FIG. 3 illustrates a cross-section view of an alternative construction of the high-speed flexible cable (110. As shown in FIG. 3, the conductive metal signal layer (116, FIG. 2) of the high-speed flexible cable (110) may include differential pairs. The term differential pair is to be understood as two tightly coupled signal media wherein one medium is a positively driven signal medium (117) and the other is a negatively driven medium (118).

The basic concept behind differential pairs is that the driver and the receiver PCBs (100, 120; FIG. 1) have been designed to operate by having the final data signal be the difference of the signals on the two tightly-coupled signal media (117, 118). Differential pairs are especially suited for high-speed data transmission because both the positively driven signal medium (117) and the negatively driven signal medium (118) should have the same amount of noise imposed by the environment. As a result, the differencing performed by the PCBs should cancel out the aggregate external noise, leaving only internally generated noise. This noise immunity characteristic of differential pairs (117, 118) can be incorporated in a high-speed flexible cable (110) with multiple conductors by running a number of differential pairs (117, 118) in the high-speed flexible cable (110) side by side separated by a dielectric laminate (112) as shown in FIG. 3.

Returning again to FIG. 1, a number of signal-enhancing circuits (130) are communicatively coupled to the high-speed flexible cable (110). The signal-enhancing circuitry (130) may include any circuit, active or passive, which when communicatively coupled to the high-speed multi-conductor flexible cable (110) improves the signal integrity of the high-speed signals that are passing through the high-speed flexible cable (130). More specifically, the signal-enhancing circuitry (130) may include, but is not limited to, fibre channel equalization networks, other high pass filters, and capacitors.

Traditionally, when signal-enhancing circuitry (130) was used in connection with data transmission from one PCB to another PCB, the signal-enhancing circuits (130) were placed directly on the PCBs (100, 120), due mainly to the ease of connection. However, by mounting the signal-enhancing circuits (130) on the PCBs (100, 120), valuable board space was occupied causing an increase in overall PCB size. According to FIG. 1, the signal-enhancing circuits (130) are communicatively mounted on the high-speed flexible cable (110) thereby preserving valuable circuit board space.

Figure 4:
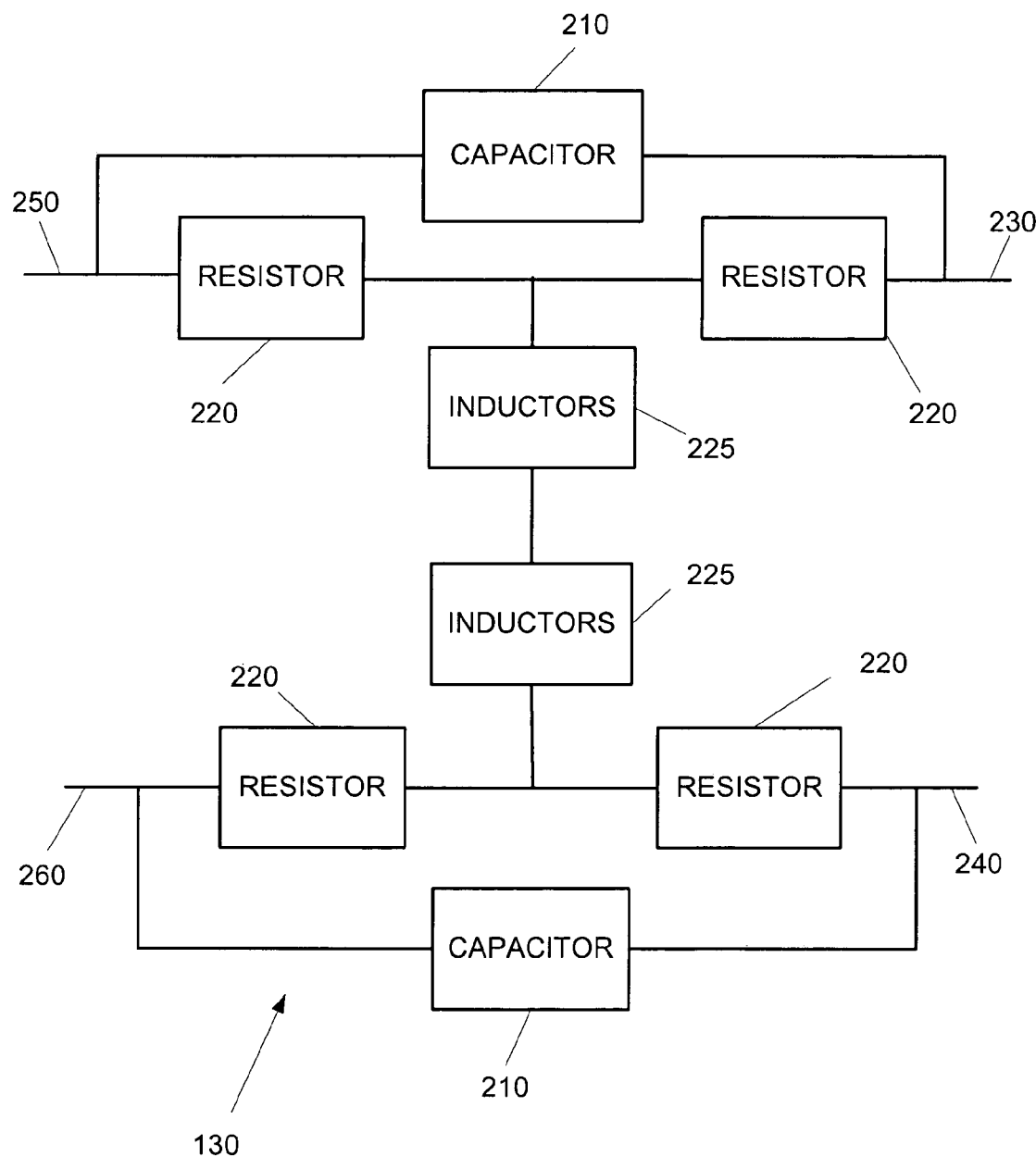
FIG. 4 is a block diagram illustrating an exemplary construction of an equalization network according to one embodiment of the present invention.

FIG. 4 illustrates one embodiment of the signal-enhancing circuitry (130) in the form of a fibre channel equalization network. As shown in FIG. 4, the equalization network (130) includes two leads (230, 240) for receiving high-speed data signals from a differential pair included in the conductive metal signal layers (117, 118; FIG. 3) of a high-speed flexible cable (110). The two signal receiving leads of the equalization network (130) are made up of a negative data input (230) and a positive data input (240). The inputs subsequently lead to a number of resistors (220), inductors (225), and capacitors (210), which are communicatively arranged as illustrated in FIG. 4 so that they perform a high-pass filtering function on incoming data signals.

Following the configuration of resistors (220), inductors (225), and capacitors (210), which form the fibre channel equalization network (130), are a negative output lead (250) and a positive output lead (260). The negative output lead (250) and the positive output lead (260) are subsequently connected to the same differential pair, included in the conductive metal signal layers (117, 118; FIG. 3) of the high-speed flexible cable (110), that was connected to the negative data input (230) and the positive data input (240) of the equalization network (130).

A number of methods may be used to communicatively couple the equalization network (130) to the high-speed flexible cable (110). When connecting the equalization network (130) to the conductive metal signal layers of a multi-conductor flexible cable (110), the area around the connections should be stable enough to avoid undue stress on the means of direct connection to the conductive metal signal layers. The means of connection to the conductive metal signal layers includes, but is in no way limited to soldered connections and surface mount technology (SMT) pads. An SMT pad is to be understood both here and in the appended claims as a conductive metal pad composed of copper plus any number of technology dependent finishes that are capable of being soldered or otherwise communicatively connected to a circuit board or other signal conducting medium.

As shown in FIG. 5, a multi-conductor flexible cable (110) may be formed with a rigid section (300) in line with the conductive metal signal layers of the flexible cable (110). A rigid material including, but in no way limited to, plastic, ceramic, or metal may be secured to the flexible cable (110), preferably on the surface opposite the conductive metal signal layers. By forming the rigid section (300) opposite the conductive metal signal layers, a location for mounting the equalization networks (130) is established with the rigid section (300) limiting undue movement and stress on the components of the networks (130). The input (230, 240; FIG. 4) leads and the output (250, 260; FIG. 4) leads of the equalization networks (130) may then be communicatively connected to the metal signal layers of the flexible cable (110) by the use of solder, SMT pads, or any other electronic coupling means.

Figure 6:
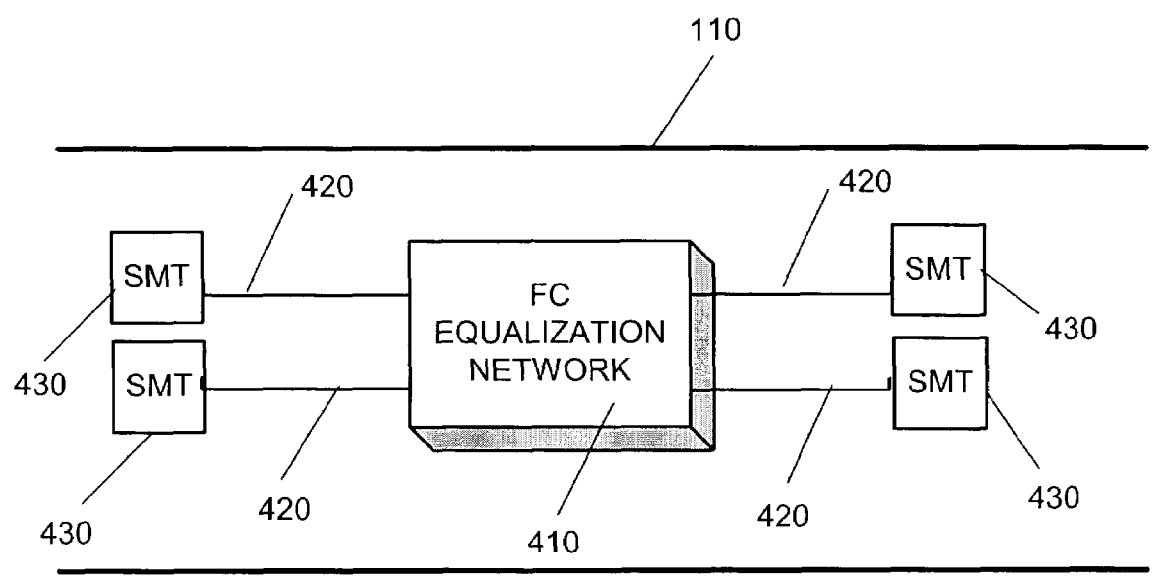
FIG. 6 illustrates a method for mounting an electrical component to a high-speed multi conductor flexible cable according to one embodiment of the present invention.

FIG. 6 illustrates an alternative method for mounting a signal-enhancing circuit to a high-speed flexible cable (110). As shown in FIG. 6, the equalization network (410) may be coupled to the metal signal layers (not shown) of the high-speed flexible cable (110) by running short signal wires (420) from the equalization network (410) to system mount technology (SMT) pads (430). The pads (430), in turn, provide an electrical connection between the short signal wire (420) and a data line in the high-speed flexible cable (110).

By using short signal wires (420) to attach the equalization network (410) to the flexible cable (110) the movement of the flexible cable is somewhat decoupled from the rigid body of the equalization network (130). In other words, the cable (110) can flex to a certain extent defined by the length of the short signal wires (420) before any stress is placed on the network (410) or on the connections between the network (410) and the cable (110). In particular, this decoupling of the equalization network (410) reduces the amount of strain on the SMT pads (430).

Figure 7:
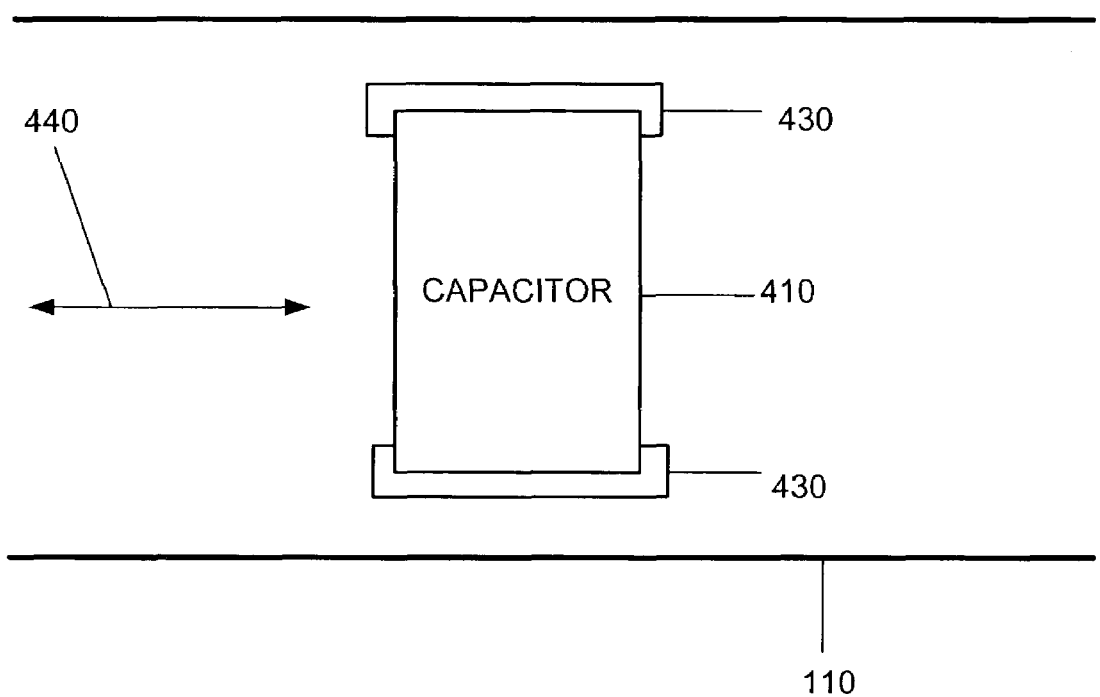
FIG. 7 illustrates an additional method for mounting an electrical component to a high-speed multi conductor flexible cable according to one embodiment of the present invention.

FIG. 7 illustrates an additional method for coupling a signal-enhancing circuit to a high-speed flexible cable (110). According to the embodiment illustrated in FIG. 7, a signal-enhancing circuit such as a capacitor (410) may be attached directly to the high-speed flexible cable (110) perpendicular to the line of flex (440) of the high-speed flexible cable (110). The line of flex (440) runs along the length of the cable (110). The cable is flexible across, rather than along, the line of flex (440), meaning that the cable readily flexes along its length with the width of the cable (110) remaining relatively planar. However, the cable is relatively rigid across its width and will not readily fold along the line of flex (440).

According to this embodiment, SMT pads (430) may be directly coupled to the rigid capacitor body (410) without any short signal wire (420; FIG. 6). The natural stiffness of the high-speed flexible cable (110) tends to resist bending that would stress the capacitor (410) along the line of flex (440). The resistance by the high-speed flexible cable (110) to bending along the line of flex (440) may be sufficient to allow direct mounting of the capacitor body (410) without causing undue stress on the SMT pads (430).

Figure 8:
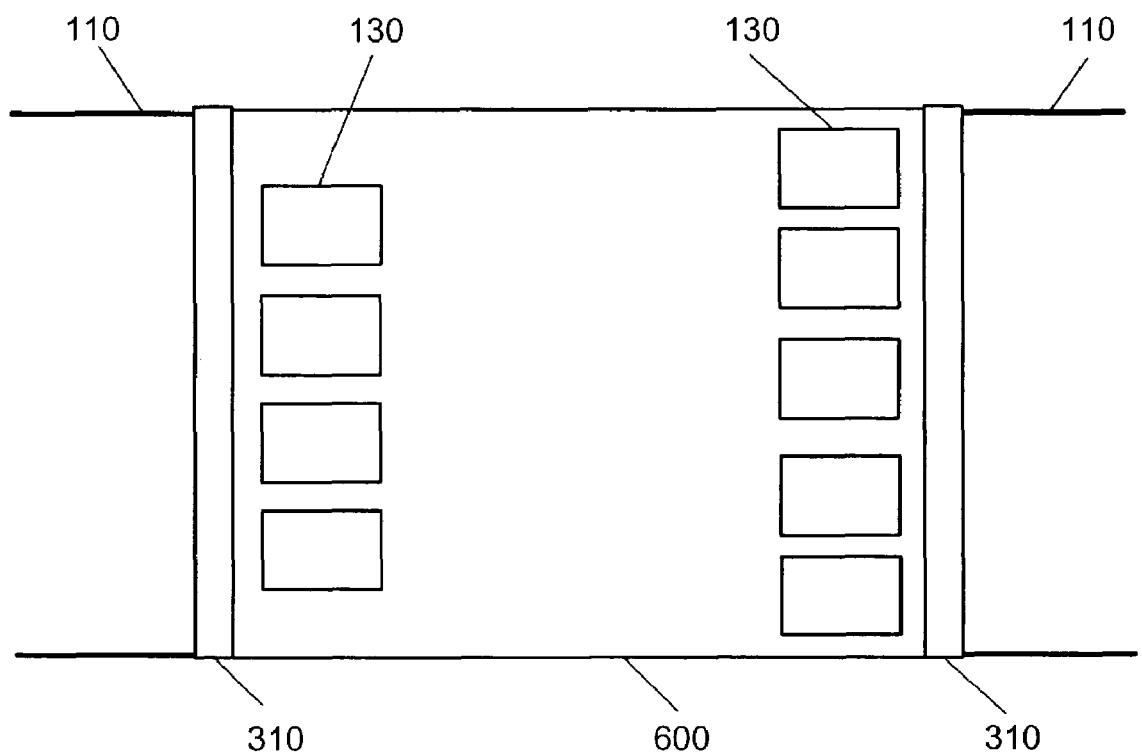
FIG. 8 illustrates an intermediary printed circuit board containing signal-enhancing circuitry connecting two high-speed multi conductor flexible cables according to one embodiment of the present invention.

Yet another method for coupling the signal-enhancing device to a high-speed flexible cable (110) is illustrated in FIG. 8. As shown in FIG. 8, an additional PCB (600) may be connected in line with the high-speed flexible cable (110) using pin and socket connectors (310). The equalization networks (130) could then be hard mounted to the PCB (600) providing sufficient structural support to prevent damage of the signal connection areas without greatly reducing the flexibility of the high-speed flexible cable (110).

The equalization network (130) does not have an electrical requirement to be placed in any specific location. Thus, the network (130) can be placed anywhere on the body of the flex cable (110) as long as the data signal passes through the equalization network (130) prior to reaching their destination, e.g., PCB #2 (120, FIG. 1).

An additional method for coupling the signal-enhancing device to a high-speed flexible cable (110) is to etch the geometry of the conductive metal signal layers (116; FIG. 2) of the high-speed flexible cable in such a manner that they act as a signal-enhancing device in line with the high-speed signals. That is, the shape of the high-speed conductive metal signal layers that pass through the flexible cable can be altered in one or more areas in order to produce the desired signal conditioning (e.g. high-pass filtering). According to this embodiment, no additional components are connected to the high-speed flexible cable, rather, the construction of the conductive metal signal layers perform the desired function.

Exemplary Implementation and Operation

Returning again to FIG. 1, operation begins as PCB #1 (100) transmits a data signal to PCB #2 (120). The data signal is transmitted from PCB #1 (100) at a high-speed data transmission rate through the pin and socket connectors (310; FIG. 8) and across the high-speed flexible cable (110).

High-speed data is typically transferred from PCB #1 (100) to PCB #2 (120) using square wave signals that are approximated using a Fourier series transform. A Fourier series approximated waveform is composed of both high frequency and low frequency signals that are combined to approximate a desired waveform. When these approximated waveforms are transmitted from PCB #1 (100), they closely approximate the desired waveform. However, a number of unique issues arise from the transmission of high-speed transmission rate signals over high-speed flexible cables (110), including but not limited to jitter, waveform degradation, and delay differences.

Jitter is the deviation in, or displacement of, some aspect of the pulses in a high-frequency digital signal. The deviation can be in terms of amplitude, phase timing, or the width of the signal pulse. Another definition of jitter could be a period frequency displacement of the data signal from its ideal location. Among the causes of jitter are electromagnetic interference (EMI) and crosstalk with other signal lines.

Waveform degradation due to frequency dependant loss in the interconnecting media occurs because signals of different frequencies are attenuated to different degrees as they are transmitted across interconnecting media. More specifically, high frequency signals are attenuated to a greater degree than low frequency signals as they pass through the same interconnecting media. Since Fourier series data signals are typically a combination of both high-frequency and low-frequency signals, the different rates of attenuation degrade the quality of the combined data signal.

Not only are data signals of different frequencies attenuated at different degrees during high-speed transmission, they also have different delay characteristics. The different rates of delays cause the low frequency signals and the high-frequency signals to be offset to some degree. The result of the signal offset is a degradation of signal edges and a reduced data window where the different frequencies appropriately overlap and the waveform has the proper amplitude. Moreover, additional forms of signal degradation may occur such as noise from electromagnetic interference (EMI), especially in longer high-speed flexible cables.

According to the system illustrated in FIG. 1, a signal-enhancing circuit (130) in the form of a high-pass filter is placed along the signal path of the high-speed flexible cable (110). As the high-speed signal is transmitted from the first printed circuit board (100) to the second printed circuit board (120) the high-speed signal is transmitted through the signal-enhancing circuit (130), which acts as a high-pass filter in order to correct the signal degrading effects of high-speed transmission.

One embodiment includes the high-speed signal passing through an equalization network (130) prior to its reception in the second PCB (120). The equalization network (130) compensates for the frequency dependent attenuation that typically occurs in high-speed signal transmission by using a filter tailored to the specific signaling medium. A filter is a device that selectively sorts signals and passes through a desired range of signals while suppressing others. In the simplest implementation, equalization can be done through a high pass filter to attenuate the lower frequencies to the level of the higher frequency attenuation.

As the data signal passes through the equalization network (130) of the present invention, the high-frequency component of the data signal is allowed to pass unaffected while the low-frequency component of the data signal is attenuated. The amount of attenuation in the low-frequency component caused by the equalization network (130) is adjusted to mimic the attenuation suffered by the high-frequency component as it is transmitted through the flexible cable (110), thereby reducing the amount of jitter in the signal.

The high-pass filter is also able to adjust for the different delay rates of the high and low frequencies by delaying the low-frequency component of the data signal to correspond with the naturally occurring high-frequency delay. The output from the equalization network (130) is an attenuated version of the original data signal that was transmitted from the first PCB (100). Since both the high-frequency component and the low-frequency component of the resulting attenuated signal have both been attenuated to the same degree, signal integrity is preserved. Moreover, the signal received in the second PCB (120) is affected less by signal degradation than typical high-speed data signals.

While the foregoing examples have been explained using a point-to-point topology, the teachings of this specification may also be applied to any configuration used to transmit data signals over a high-speed flex cable including, but in no way limited to, fabric or loop topology. Moreover, the some of the preceding examples were described using differential pairs as the signal layers. However, the principles explained herein can be applied to any signaling technology that suffers from jitter and high-frequency degradation.

Alternative Embodiments

In an alternative embodiment, a bypassing capacitor may also be communicatively mounted on the body of a high-speed flexible cable as illustrated in FIG. 7. Bypassing capacitors (410) may be periodically placed along a high-speed flexible cable (110) in order to reduce signal noise while reducing printed circuit board space requirements. By mounting bypassing capacitors (410) at regular intervals, using the mounting methods disclosed above, an alternating current (AC) tie is provided between the planes thereby changing the effective dimensions of the power structure and reducing noise caused by resonance and/or electromagnetic interference.

The preceding description has been presented only to illustrate and describe embodiments of invention. It is not intended to be exhaustive or to limit the invention to any precise form disclosed. Many modifications and variations are possible in light of the above teaching. It is intended that the scope of the invention be defined by the following claims.

What is claimed is:

1. A method for decreasing high-frequency attenuation effects in a flexible cable comprising communicatively coupling signal-enhancing circuitry to a conductive signal layer of said flexible cable, said circuitry being disposed on an outer or insulated layer of said flexible cable and decreasing high-frequency attenuation effects in signals passing through said signal layer.

2. The method of claim 1, wherein said signal layer of said flexible cable comprises fibre channel differential pairs formed between two dielectric layers.

3. The method of claim 2, wherein said signal-enhancing circuitry comprises a high-pass filter.

4. The method of claim 3, wherein said high pass filter further comprises a fibre channel equalization network.

5. The method of claim 1, wherein said communicatively coupling said signal-enhancing circuitry to said signal layer of said flexible cable further comprises:

securing a rigid material to a first surface of said flexible cable; and communicatively coupling said signal-enhancing circuitry to a second surface of said flexible cable opposite said rigid material.

6. The method of claim 5, wherein said communicatively coupling said signal-enhancing circuitry to a second surface of said flexible cable comprises soldering an electric lead of said signal-enhancing circuitry to a signal wire of said signal layer of said flexible cable.

7. The method of claim 1, wherein said communicatively coupling said signal-enhancing circuitry to said signal layer of said flexible cable further comprises:

communicatively coupling a first end of a lead wire to said signal-enhancing circuitry; and communicatively coupling a second end of said lead wire to said signal layer of said flexible cable.

8. The method of claim 7, wherein said communicatively coupling a second end of said lead wire to a signal layer of said flexible cable further comprises securing said second end of said lead wire to said signal layer of said flexible cable using a surface mount technology pad.

9. The method of claim 1, wherein said communicatively coupling said signal-enhancing circuitry to said signal layer of said flexible cable further comprises:

communicatively coupling a printed circuit board in-line with said signal layer of said flexible cable; and wiring said signal-enhancing circuitry to said printed circuit board and in-line with said signal layer of said flexible cable.

10. The method of claim 1, wherein said communicatively coupling of said signal-enhancing circuitry to said signal layer of said flexible cable further comprises:

placing said signal-enhancing circuitry perpendicular to a line of flex of said flexible cable; and communicatively coupling said signal-enhancing circuitry to said signal layer of said flexible cable.

11. The method of claim 1, wherein said communicatively coupling of said signal-enhancing circuitry further comprises etching said signal layer of said flexible cable so that said etched signal layer performs high pass filtering.

12. The method of claim 1, further comprising disposing said circuit directly on a surface of said flexible cable.

13. The apparatus of claim 1, wherein said circuitry is disposed directly on a surface of said flexible cable.

14. The method of claim 1, wherein said signals are electric signals based on a Fourier-series with a high-frequency component and a low-frequency component combined to approximate a desired waveform.

15. A method for decreasing high-frequency attenuation effects in a flexible cable comprising:

communicatively coupling signal-enhancing circuitry to a signal layer of said flexible cable using lead wire;

wherein said signal-enhancing circuitry is mechanically decoupled from flexing of said flexible cable through flexibility of said lead wire.

16. An apparatus for transmitting data signals between electrical devices while reducing high-frequency signal attenuation effects comprising:

a flexible cable including a plurality of signal lines; and signal-enhancing circuitry communicatively coupled to one or mare of said signal lines of said flexible cable, wherein said signal-enhancing circuitry functions as a high-pass filter;

wherein said circuitry is disposed on said flexible cable.

17. The apparatus of claim 16, wherein said flexible cable comprises a dielectric material surrounding said signal lines.

18. The apparatus of claim 17, wherein said plurality of signal lines further comprises fibre channel differential pairs.

19. The apparatus of claim 18, wherein said signal-enhancing circuitry further comprises a fibre channel differential pair equalization network.

20. The apparatus of claim 16, wherein said signal-enhancing circuitry further comprises a capacitor for reducing signal noise.

21. The apparatus of claim 19, wherein said fibre channel differential pair equalization network is mounted directly on said dielectric material of said flexible cable.

22. The apparatus of claim 19, wherein said fibre channel differential pair equalization network is communicatively coupled to one of said signal line of said flexible cable through a lead wire.

23. The apparatus of claim 22, wherein:

a first end of said lead wire is communicatively coupled to a lead of said fibre channel differential pair equalization network; and a second end of said lead wire is communicatively coupled to a signal line of said flexible cable.

24. An apparatus for transmitting data signals between electrical devices while reducing high-frequency signal attenuation effects comprising:

a flexible cable including a plurality of signal lines; and signal-enhancing circuitry communicatively coupled to one or more of said signal lines of said flexible cable with lead wire, wherein said circuitry is mechanically decoupled from flexing of said flexible cable by flexibility of said lead wire.

25. The apparatus of claim 24, wherein said signal-enhancing circuitry comprises a high-pass filter.

26. The apparatus of claim 24, wherein said signal-enhancing circuitry comprises a fibre channel differential pair equalization network.

27. An apparatus for transmitting data signals between electrical devices while reducing the effects of high-frequency signal attenuation comprising:

signal communication means for signal communication; and attenuation means for attenuating a low-frequency component of a Fourier-series-based data signal to match a natural attenuation that occurs to a high-frequency component of said Fourier-series-based data signal when transmitted through said signal communication means;

wherein said attenuation means is physically mounted on said means for signal communication.

28. The apparatus of claim 27, wherein said signal communication means comprise means for sending multiple data signals simultaneously.

29. The apparatus of claim 28, wherein said signal communication means further comprise a multi-conductor flexible cable.

30. The apparatus of claim 29, wherein conductors of said multi-conductor flexible cable comprise fibre channel differential pairs.

31. apparatus of claim 30, wherein said attenuation means for attenuating the low-frequency component of a Fourier-series-based data signal to match the natural attenuation that occurs to the high-frequency component of said Fourier-series-based data signal when transmitted through said signal communication means comprise a circuit which, when presented with said Fourier-series-based data signal, performs a high-pass filtering function on said Fourier-series-based data signal.

32. The apparatus of claim 31, wherein said attenuation means for attenuating the low-frequency component of a Fourier-series-based data signal further comprise a fibre channel differential pair equalization network.

33. The apparatus of claim 27, further comprising means for mounting said attenuation means on said signal communications means, wherein said means for mounting said attenuation means reduces strain on electrical connections between said attenuation means and said signal communication means.

* * * * *

UNITED STATES PATENT AND TRADEMARK OFFICE
CERTIFICATE OF CORRECTION

PATENT NO. : 7,276,986 B2  Page 1 of 1
APPLICATION NO. : 10/358903
DATED : October 2, 2007
INVENTOR(S) : Andrew H. Barr et al.

It is certified that error appears in the above-identified patent and that said Letters Patent is hereby corrected as shown below:

In column 9, line 43, in Claim 12, delete "circuit" and insert -- circuitry --, therefor.

In column 9, line 62, in Claim 16, delete "mare" and insert -- more --, therefor.

In column 10, line 59, in Claim 31, insert -- The -- before "apparatus".

Signed and Sealed this

Fourteenth Day of October, 2008

JON W. DUDAS
*Director of the United States Patent and Trademark Office*